United States Patent [19]

Konishi et al.

[11] Patent Number: 4,809,230

[45] Date of Patent: Feb. 28, 1989

[54] SEMICONDUCTOR MEMORY DEVICE WITH ACTIVE PULL UP

[75] Inventors: Yasuhiro Konishi; Kazuyasu Fujishima; Masaki Kumanoya; Hideshi Miyatake; Hideto Hidaka; Katsumi Dosaka, all of Hyogo, Japan

[73] Assignee: Mitsubishi Denki Kabushiki Kaisha, Tokyo, Japan

[21] Appl. No.: 938,065

[22] Filed: Dec. 4, 1986

[30] Foreign Application Priority Data

Dec. 6, 1985 [JP] Japan .................................. 60-275566

[51] Int. Cl.$^4$ .......................... G11C 7/00; G11C 11/40
[52] U.S. Cl. .................................... 365/189; 365/193; 365/203; 365/204
[58] Field of Search ............... 365/203, 204, 207, 189, 365/193, 233

[56] References Cited

U.S. PATENT DOCUMENTS

| | | | |
|---|---|---|---|
| 4,291,392 | 9/1981 | Proebsting | 365/203 |
| 4,528,696 | 7/1985 | Ochii et al. | 365/203 |
| 4,543,501 | 9/1985 | McAlexander, III et al. | 365/203 |
| 4,601,017 | 7/1986 | Mochizuki et al. | 365/203 X |
| 4,633,443 | 12/1986 | Childers | 365/203 |
| 4,638,459 | 1/1987 | Pechar, Jr. et al. | 365/203 X |
| 4,677,313 | 6/1987 | Mimoto | 365/203 X |

*Primary Examiner*—Stuart N. Hecker
*Assistant Examiner*—Alyssa H. Bowler
*Attorney, Agent, or Firm*—Lowe, Price, Leblanc, Becker & Shur

[57] ABSTRACT

A MOS dynamic type RAM comprises memory cells (10), dummy cells (11), bit line pairs (BL, $\overline{BL}$), word lines (WL), dummy word lines (DWL) and sense amplifiers (12). In a non-active cycle, the potentials of each pair of bit lines (BL, $\overline{BL}$) are precharged at ½ of a supply potential $V_{CC}$. Each sense amplifier (12) operates in an active cycle following the non-active cycle, while each active pull-up circuit (13) pulls up the potential of a higher level one of the pair of bit lines to $V_{CC}$. This active cycle is defined by an internal RAS internal signal, which is generated by a NAND circuit (27) in response to an external $\overline{RAS}$ signal and an $\overline{RPW}$ signal obtained by delaying the external $\overline{RAS}$ signal by a delay circuit (20) and having a trailing edge obtained by delaying the trailing edge of the external $\overline{RAS}$ signal by a prescribed period.

5 Claims, 2 Drawing Sheets

SEMICONDUCTOR MEMORY DEVICE WITH ACTIVE PULL UP

BACKGROUND OF THE INVENTION

1. Field of the Invention

The present invention relates to a semiconductor memory device, and more particularly, it relates to improvement in a semiconductor memory device such as a MOS (metal oxide semiconductor) dynamic type RAM (random access memory) provided with active pull-up circuits.

2. Description of the Prior Art

In general, a MOS dynamic type RAM comprises a plurality of pairs of bit lines and a sense amplifier provided for each pair of bit lines. Before reading out information from a memory cell, the potentials of a corresponding pair of bit lines are precharged to a supply potential $V_{CC}$. When the memory cell for reading information is selected to cause small potential difference between the corresponding pair of bit lines, the potential of the lower level one of the bit line pair is lowered to a ground potential $V_{SS}$ by the sense amplifier. Thus, the sense amplifier is adapted to detect and amplify the small potential difference between the corresponding pair of bit lines thereby to read information from the memory cell. In practice, however, the higher level one of the bit line pair may be slightly lowered by discharge upon starting of the aforementioned sensing operation or current leakage after completion of the sensing operation. In such case, the level of rewriting in the memory cell is also lowered, and hence the conventional MOS dynamic type RAM may be provided with active pull-up circuits. Each active pull-up circuit is adapted to raise only the potential of the higher level bit line to the supply potential $V_{CC}$. For example, U.S. Pat. No. 4,291,392 discloses a dynamic type memory device provided with such active pull-up circuits.

On the other hand, the precharge level may be set at the intermediate level between the supply potential $V_{CC}$ and the ground potential $V_{SS}$ in order to reduce supply current when the bit line is charged or discharged, and also in this case, the potential of the higher level bit line must be raised to the supply potential level $V_{CC}$ by an active pull-up circuit.

FIG. 1 is a circuit diagram schematically showing an example of a conventional MOS dynamic type RAM provided with active pull-up circuits.

Description is now made on the structure of the circuit as shown in FIG. 1.

Referring to FIG. 1, a pair of bit lines BL and $\overline{BL}$ are provided to intersect with a word line WL and a dummy word line DWL respectively. A memory cell 10 is connected to the word line WL and the bit line BL, while a dummy cell 11 is connected to the dummy word line DWL and the bit line $\overline{BL}$. In further detail, the memory cell 10 is formed by a MOS transistor 4 and a capacitor 8 of capacitance $C_M$, and the MOS transistor 4 has a first electrode connected with the bit line BL, a second electrode connected with a cell plate electrode CP through the capacitor 8 and a gate electrode connected with the word line WL. The dummy cell 11 is formed by a MOS transistor 5 and a capacitor 9 of capacitance $C_D$, and the MOS transistor 5 has a first electrode connected with the bit line $\overline{BL}$, a second electrode connected with a cell plate electrode CP through the capacitor 9 and a gate electrode connected with the dummy word line DWL.

Further, a series circuit of MOS transistors 6 and 7 is connected between the pair of bit lines BL and $\overline{BL}$. The MOS transistor 6 has a first electrode connected with the bit line BL and a second electrode connected with a first electrode of the MOS transistor 7. A second electrode of the MOS transistor 7 is connected with the bit line $\overline{BL}$. A precharge potential $V_P (=\frac{1}{2} \cdot V_{CC})$ is applied to the juncture between the second electrode of the MOS transistor 6 and the first electrode of the MOS transistor 7 for precharging the potentials of the pair of bit lines BL and $\overline{BL}$. The MOS transistors 6 and 7 are on-off controlled by a precharge signal $\phi_P$ applied to the respective gate electrodes thereof.

On the other hand, a sense amplifier 12 formed by MOS transistors 1 and 2 is connected between the pair of bit lines BL and $\overline{BL}$. A first electrode of the MOS transistor 1 is connected with the bit line $\overline{BL}$ and a second electrode thereof is connected with a first electrode of the MOS transistor 2. A second electrode of the MOS transistor 2 is connected with the bit line BL. The gate electrode of the MOS transistor 1 is connected with the bit line BL, and the gate electrode of the MOS transistor 2 is connected with the bit line $\overline{BL}$. The juncture between the second electrode of the MOS transistor 1 and the first electrode of the MOS transistor 2 is grounded through a MOS transistor 3. The MOS transistor 3 is on-off controlled by a sense amplifier activating signal $S_0$ applied to its gate electrode. Namely, the operation of the sense amplifier 12 is controlled by the sense amplifier activating signal $S_0$ to detect the potentials of the pair of bit lines BL and $\overline{BL}$ and lower the potential of the lower level bit line to a ground potential $V_{SS}$.

Further, an active pull-up circuit 13 is connected between the pair of bit lines BL and $\overline{BL}$. This active pull-up circuit 13 is controlled by an active pull-up signal AR, to pull up the potential of the higher level one of the pair of bit lines BL and $\overline{BL}$ to the supply potential $V_{CC}$.

For the sake of convenience, FIG. 1 shows only one pair of bit lines, one word line, one dummy word line, one memory cell, one dummy cell, a group of precharging MOS transistors and one active pull-up circuit. However, an actual MOS dynamic type RAM is provided with a plurality of pairs of bit lines intersecting with a plurality of word lines and a plurality of dummy word lines. A memory cell is connected between one of each pair of bit lines and each word line. Further, a dummy cell is connected to each dummy word line for each pair of bit lines. Such memory cells and dummy cells are arrayed in the form of a matrix to form a memory cell array. Further, a group of precharge MOS transistors, one active pull-up circuit and one sense amplifier are connected with each pair of bit lines.

FIG. 2 is a timing chart for illustrating the read/write operation of the conventional MOS dynamic type RAM as shown in FIG. 1.

With reference to FIG. 2, description is now made on the operation of the circuit as shown in FIG. 1. Referring to FIG. 2, symbol EXT·$\overline{RAS}$ represents an external row address strobe signal, symbols RAS and $\overline{RAS}$ represent internal row address strobe signals, symbol WL represents potential change of the word line WL, symbol DWL represents potential change of the dummy word line DWL, symbol BL represents potential change of the bit line BL and symbol $\overline{BL}$ represents potential change of the bit line $\overline{BL}$. The internal $\overline{RAS}$ signal, the precharge signal $\phi_p$, the sense amplifier activating signal $S_0$ and the active pull-up signal AR are generated from a conventional circuit (not shown) in sequence after generation of the external RAS signal.

It is assumed here that data "1" is written in the memory cell 10 and data "0" is written in the dummy cell 11. As shown in FIG. 2, during when the external $\overline{RAS}$ signal is at an "H" level, i.e., when the MOS dynamic type RAM is in a non-active cycle, the precharge signal $\phi_P$ is at an "H" level, whereby the MOS transistors 6 and 7 are brought into ON states and the potentials of the pair of bit lines BL and $\overline{BL}$ are precharged to the precharge voltage $V_P = (\frac{1}{2} \cdot V_{CC})$.

Then, the external $\overline{RAS}$ signal falls at a time $t_1$ and the internal RAS signal rises and the internal $\overline{RAS}$ signal falls slightly after the same so that the MOS dynamic type RAM enters an active cycle. At the same time, the precharge signal $\phi_P$ falls to complete the operation for precharging the bit lines BL and $\overline{BL}$.

Then, a row address signal (not shown) is latched to be supplied to a row decoder (not shown), which in turn decodes the row address signal. WL and DWL rise at a time $t_2$, whereby the word line WL and the dummy word line DWL are selected. As a result, the memory cell data is read on the bit line BL from the memory cell 10 and the dummy cell data is read on the bit line $\overline{BL}$ from the dummy cell 11, to cause potential difference between the pair of bit lines BL and $\overline{BL}$. In order to read/write the memory cell data at the full level, the respective potentials of the word line WL and the dummy word line DWL are raised up to $V_{CC} + V_{TH} + \alpha$, where $V_{TH}$ represents the threshold voltage of the MOS transistors 4 and 5.

Then, the sense amplifier activating signal $S_0$ rises at a time $t_3$, to start the sensing operation. Namely, the sense amplifier 12 detects the potentials of the pair of bit lines BL and $\overline{BL}$, to lower the potential of the lower level bit line $\overline{BL}$ to the ground potential $V_{SS}$. The potential of the higher level bit line BL is also slightly lowered at this time.

Then, the active pull-up signal AR rises at a time $t_4$ to drive the active pull-up circuit 13, which in turn pulls up the potential of the higher level bit line BL to the supply potential $V_{CC}$.

Then, the external $\overline{RAS}$ signal rises at a time $t_5$, whereby the internal RAS signal falls and the internal $\overline{RAS}$ signal rises immediately in response thereto. Then the respective potentials of the word line WL and the dummy word line DWL and the sense amplifier activating signal $S_0$ fall and further the active pull-up signal AR falls to complete the pull-up operation.

Then, the precharge signal $\phi_P$ rises to start precharging the potentials of the pair of bit lines BL and $\overline{BL}$ at the precharge voltage $V_P (= \frac{1}{2} \cdot V_{CC})$, so that the MOS dynamic type RAM enters a non-active cycle.

As hereinabove described, the internal RAS signal defines non-active and active cycles of the MOS dynamic type RAM, so that the memory operation is performed in the active cycle. The period during when the external $\overline{RAS}$ signal is at an "L" level, i.e., the period corresponding to $t_5 - t_1$ is called as an active cycle time $t_{AC}$.

The aforementioned active pull-up operation is generally started immediately upon starting of the sensing operation and ended immediately after rise of the external $\overline{RAS}$ signal, while the aforementioned active cycle time $t_{AC}$ must be sufficiently long in order to completely pull up the potential of the higher level bit line. Namely, when an active pull-up circuit is employed, the active cycle time $t_{AC}$ must be prolonged by the time required for raising the potential of the higher level bit line to the supply potential $V_{CC}$ in comparison with the case of employing no such active pull-up circuit, leading to a disadvantage in view of the operating speed.

SUMMARY OF THE INVENTION

Briefly stated, provided according to the present invention is a semiconductor memory device which comprises a plurality of pairs of bit lines, a plurality of word lines provided to intersect with the plurality of pairs of bit lines, a plurality of memory cells provided in correspondence to the intersection points between the bit line pairs and the word lines to be connected to the respective bit line pairs and the respective word lines, precharge means provided for each pair of bit lines for precharging the potentials of the bit line pair to a first constant potential, memory cell selection/readout means for selecting a memory cell for reading data by selecting a word line after precharging of the bit line pair by the precharge means and reading the data from the selected memory cell, sense amplifier means provided for each pair of bit lines to detect the potentials of the bit line pair upon reading of the data from the selected memory cell thereby to lower the potential of a lower level one of the pair of bit lines to a second constant potential, means for supplying an external row address strobe signal having a constant duration, delay means for delaying the external row address strobe signal by a prescribed period and an internal row address strobe signal generating means for generating an internal row address strobe signal having a trailing edge obtained by delaying the trailing edge of the external row address strobe signal by a prescribed period in response to the external row address strobe signal and the output from the delay means. The internal row address strobe signal alternately repeatedly defines a non-active cycle for the operation of the precharge means and an active cycle for the operation of the memory cell selection/readout means and the sense amplifier means. The semiconductor memory device further comprises active pull-up means provided for each pair of bit lines for pulling up the potential of the higher level one of the pair of bit lines to a third constant potential from immediately after starting of the operation of the sense amplifier means to the end of the active cycle defined by the internal row address strobe signal.

According to another aspect of the present invention, the first and third constant potentials are at a supply potential level and the second constant potential is at a ground potential level.

According to still another aspect of the present invention, the second constant potential is at a ground potential level and the third constant potential is at a supply potential level, while the first constant potential is at an intermediate potential level between the second and third constant potentials.

Accordingly, a principal object of the present invention is to provide a semiconductor memory device provided with active pull-up circuits which can completely pull up potentials of higher level bit lines to a prescribed potential level without prolonging an active cycle time.

A principal advantage of the present invention is that the time for the pull-up operation for the bit lines can be sufficiently secured without delaying the trailing timing of the external row address strobe signal, whereby the operating cycle time of the semiconductor memory device can be rendered fast.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
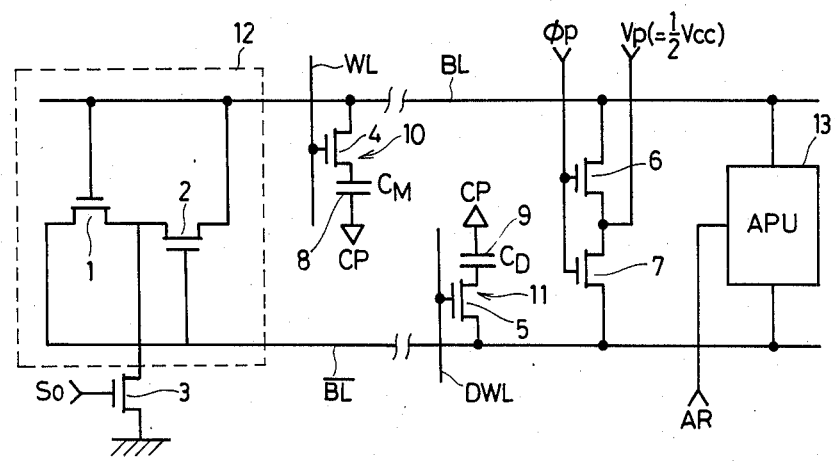
FIG. 1 is a circuit diagram showing an example of a conventional MOS dynamic type RAM provided with active pull-up circuits.
Figure 3:
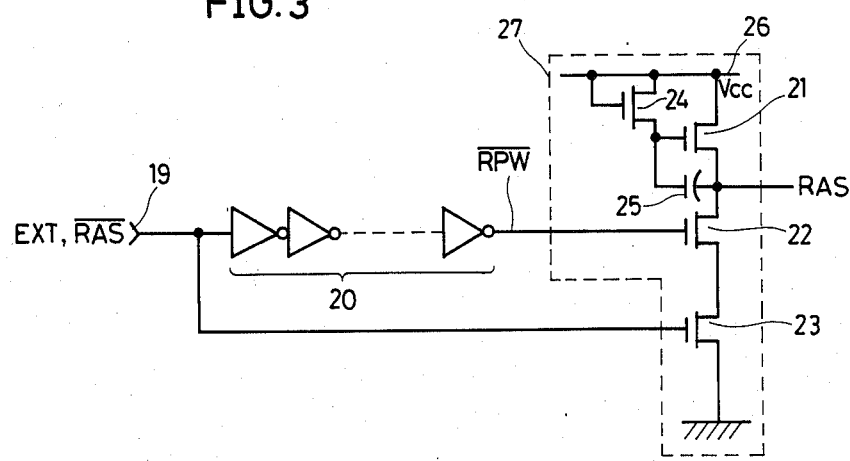
FIG. 3 is a circuit diagram showing an embodiment of the present invention.

FIG. 3 is a circuit diagram showing a part for generating a RAS precharge wait ($\overline{RPW}$) signal and an internal RAS signal forming a semiconductor memory device according to an embodiment of the present invention. Except for the part for generating the $\overline{RPW}$ signal and the internal RAS signal as shown in FIG. 3, the semiconductor memory device according to the present invention is identical in structure to the conventional semiconductor memory device as shown in FIG. 1, and hence detailed description thereof is omitted.

Description is now made on the structure of the signal generating part as shown in FIG. 3.

Referring to FIG. 3, an external $\overline{RAS}$ signal is inputted in an input terminal 19, to be supplied to the input of a delay circuit 20 formed by a plurality of inverters and to one input of a NAND circuit 27. The delay circuit 20 delays the supplied external $\overline{RAS}$ signal by a prescribed period to output the same as the $\overline{RPW}$ signal, which is supplied to the other input of the NAND circuit 27. The NAND circuit 27 is formed by four MOS transistors 21, 22, 23 and 24 and a capacitor 25. A first electrode of the MOS transistor 21 is connected to a power supply line 26 for supplying a supply potential $V_{CC}$, and a second electrode thereof is connected to a first electrode of the MOS transistor 22. A second electrode of the MOS transistor 22 is connected to a first electrode of the MOS transistor 23, whose second electrode is grounded. A first electrode and a gate electrode of the MOS transistor 24 are connected to the power supply line 26, while a second electrode thereof is connected to the gate electrode of the MOS transistor 21 and a first electrode of the capacitor 25. A second electrode of the capacitor 25 is connected to the juncture between the second electrode of the MOS transistor 21 and the first electrode of the MOS transistor 22. The gate electrode of the MOS transistor 23 is connected to the input terminal 19 as one input of the NAND circuit 27, while the gate electrode of the MOS transistor 22 is connected to the output of the delay circuit 20 as the other input of the NAND circuit 27. The NAND circuit 27 outputs the internal RAS signal in response to the external $\overline{RAS}$ signal and the $\overline{RPW}$ signal. The internal RAS signal defines non-active and active cycles of the semiconductor memory device, and the $\overline{RPW}$ signal is adapted to delay the fall timing of the internal RAS signal.

Figure 4:
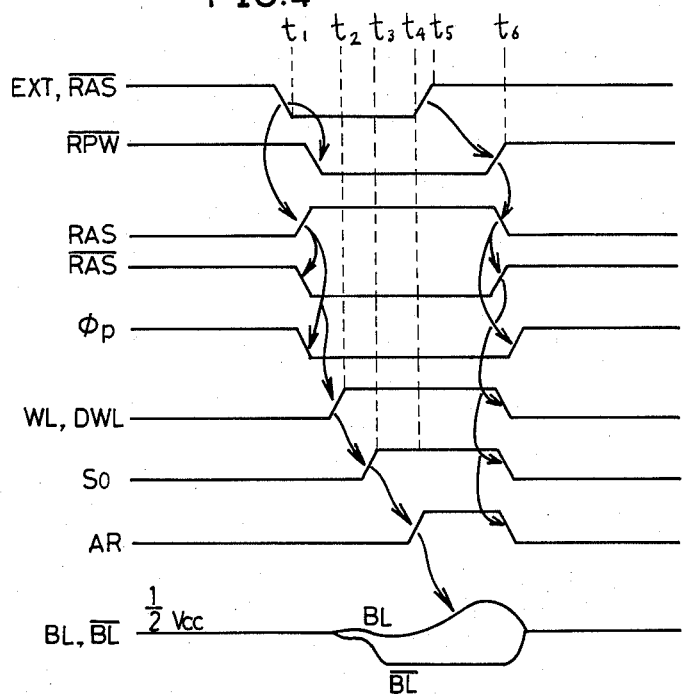
FIG. 4 is a timing chart for illustrating the operation of the embodiment of the present invention.

FIG. 4 is a timing chart for illustrating the operation of the embodiment of the present invention.

Figure 2:
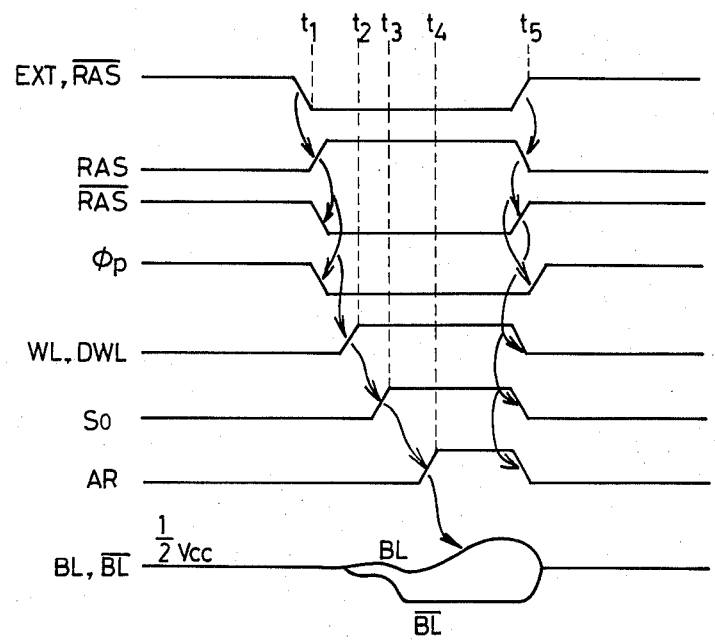
FIG. 2 is a timing chart for illustrating the operation of the circuit as shown in FIG. 1.

With reference to FIG. 4, description is made on the operation of the embodiment of the present invention. Referring to FIG. 4, the operation up to a time $t_4$ is absolutely identical to that of the conventional MOS dynamic type RAM as shown in FIGS. 1 and 2, while the external $\overline{RAS}$ signal is terminated at a time $t_5$ before the potential of the bit line BL is completely pulled up. However, since the fall timing of the internal RAS signal is controlled by the $\overline{RPW}$ signal obtained by delaying the external $\overline{RAS}$ signal, the internal RAS signal will not immediately fall upon rise of the external $\overline{RAS}$ signal at the time $t_5$, to be maintained in an "H" state. The internal RAS signal falls only when the $\overline{RPW}$ signal rises at a time $t_6$ delayed by a prescribed period from the rise of the external $\overline{RAS}$ signal. All of internal signals such as a precharge signal $\phi_P$, the potentials of a word line DWL, a sense amplifier activating signal $S_0$ and an active pull-up signal AR are controlled by the internal RAS signal and the internal $\overline{RAS}$ signal, and hence the operation for pulling up the potential of the bit line BL and rewriting in the memory cell 10 is internally continued even if the external $\overline{RAS}$ signal rises at the time $t_5$. These operations are completed by the time $t_6$. Thus, in the embodiment as shown in FIGS. 3 and 4, the time for the pull-up operation can be sufficiently prolonged without delaying the rise timing of the external $\overline{RAS}$ signal, to completely pull up the potential of the bit line to the supply potential $V_{CC}$. According to the embodiment of the present invention, therefore, the active cycle time $t_{AC}$ can be reduced by $t_6 - t_5$ in comparison with the conventional MOS dynamic type RAM as shown in FIGS. 1 and 2.

Although the above embodiment has been described with reference to the case where the precharge voltage is ½ of the supply potential $V_{CC}$, a similar effect can be obtained also in case where the precharge voltage is absolutely equal to the supply voltage $V_{CC}$.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of pairs of bit lines;
   a plurality of word lines provided to intersect with said plurality of pairs of bit lines;
   a plurality of memory cells each provided in correspondence to the intersection point between each said pair of bit lines and each said word line to be connected with said pair of bit lines and said word line;
   precharge means provided for each said pair of bit lines to precharge potentials of said pair of bit lies at a first constant potential;
   memory cell selection/readout means for selecting a memory cell for reading data by selecting said word line after precharging of said pair of bit lines by said precharge means and reading data from said selected memory cell on said pair of bit lines;
   sense amplifier means provided for each said pair of bit lines for detecting potentials of said pair of bit lines upon reading of said data from said selected memory cell to lower the potential of a lower level one of said pair of bit lines to a second constant potential;

means for supplying an external row address strobe signal having a constant duration;

delay means for delaying said external row address strobe signal by a prescribed period;

internal row address strobe signal generating means for generating an internal row address strobe signal having a trailing edge obtained by delaying the trailing edge of said external row address strobe signal by said prescribed period in response to said external row address strobe signal and the output from said delay means, said internal row address strobe signal alternately repeatedly precharge means and an active cycle for the operations of said memory cell selection/readout means and said sense amplifier means; and active pull-up means provided for each said pair of bit lines for pulling up said potential of said higher level one of said pair of bit lines from starting of the operation of said sense amplifier means to termination of said active cycle defined by said internal row address strobe signal to a third constant potential.

2. A semiconductor memory device in accordance with claim 1, wherein
said first and third constant potentials are at a supply potential level and said second constant potential is at a ground potential level.

3. A semiconductor memory device in accordance with claim 1, wherein
said second constant potential is at a ground potential level and said third constant potential is at a supply potential level, while said first constant potential is at an intermediate potential level between said second constant potential and said third constant potential.

4. A semiconductor memory device in accordance with claim 1, wherein
said delay means is formed by a plurality of inverters connected in the series form.

5. A semiconductor memory device in accordance with claim 1, wherein
said internal row address strobe signal generating means is a NAND circuit for receiving said external row address strobe signal and the output from said delay means.

* * * * *